(12) United States Patent
Sumi et al.

(10) Patent No.: US 9,374,877 B2
(45) Date of Patent: *Jun. 21, 2016

(54) ESD PROTECTION DEVICE AND METHOD FOR PRODUCING THE SAME

(71) Applicant: Murata Manufacturing Co., Ltd., Kyoto (JP)

(72) Inventors: Takahiro Sumi, Kyoto (JP); Jun Adachi, Kyoto (JP); Takayuki Tsukizawa, Kyoto (JP); Kumiko Ishikawa, Kyoto (JP)

(73) Assignee: MURATA MANUFACTURING CO., LTD., Kyoto-Fu (JP)

( * ) Notice: Subject to any disclaimer, the term of this patent is extended or adjusted under 35 U.S.C. 154(b) by 150 days.

This patent is subject to a terminal disclaimer.

(21) Appl. No.: 14/444,245

(22) Filed: Jul. 28, 2014

(65) Prior Publication Data

US 2014/0340812 A1 Nov. 20, 2014

Related U.S. Application Data

(63) Continuation of application No. PCT/JP2013/054630, filed on Feb. 23, 2013.

(30) Foreign Application Priority Data

Feb. 29, 2012 (JP) .................................. 2012-042738

(51) Int. Cl.
*H02H 3/02* (2006.01)
*H02H 9/04* (2006.01)
(Continued)

(52) U.S. Cl.
CPC .. *H05F 3/00* (2013.01); *H01B 3/12* (2013.01); *H01T 1/20* (2013.01); *H01T 4/12* (2013.01); *H02H 9/04* (2013.01); *H05K 1/0259* (2013.01); *Y10T 156/1092* (2015.01)

(58) Field of Classification Search
CPC ......... H01B 3/12; H05F 3/00; H01L 2924/00; H02H 9/046
USPC .......................................... 361/56
See application file for complete search history.

(56) References Cited

U.S. PATENT DOCUMENTS

| | | | |
|---|---|---|---|
| 4,726,991 A | 2/1988 | Hyatt | |
| 8,455,918 B2 * | 6/2013 | Adachi | H01T 1/20 257/173 |

(Continued)

FOREIGN PATENT DOCUMENTS

| | | |
|---|---|---|
| CN | 101933204 A | 12/2010 |
| CN | 102224648 A | 10/2011 |

(Continued)

OTHER PUBLICATIONS

International Search Report issued in Application No. PCT/JP2013/054630 dated May 7, 2013.

(Continued)

*Primary Examiner* — Dharti Patel
(74) *Attorney, Agent, or Firm* — Pearne & Gordon LLP

(57) ABSTRACT

Provided is an ESD protection device having high insulation reliability and good discharge characteristics. An ESD protection device includes a first discharge electrode and a second discharge electrode that are disposed so as to face each other, a discharge auxiliary electrode (18) formed so as to span between the first discharge electrode and the second discharge electrode, and an insulator base that holds the first discharge electrode, the second discharge electrode, and the discharge auxiliary electrode (18). The discharge auxiliary electrode (18) includes an aggregate of a plurality of metal particles (24) each having a core-shell structure including a core portion (22) that contains, as a main component, a first metal and a shell portion (23) that contains, as a main component, a metal oxide containing a second metal. A pore (26) is present in at least part of the shell portion (23).

20 Claims, 6 Drawing Sheets

(51) Int. Cl.
*H05F 3/00* (2006.01)
*H01T 1/20* (2006.01)
*H01T 4/12* (2006.01)
*H01B 3/12* (2006.01)
*H05K 1/02* (2006.01)

(56) References Cited

U.S. PATENT DOCUMENTS

2010/0309595 A1* 12/2010 Adachi .................... H01T 1/20 361/56
2012/0099231 A1* 4/2012 Ishihara ............. C08G 18/0823 361/56
2012/0169452 A1* 7/2012 Hiehata .................. H01C 7/108 338/21

FOREIGN PATENT DOCUMENTS

| CN | 102460867 A | 5/2012 |
| CN | 102576586 A | 7/2012 |
| JP | 63-100702 A | 5/1988 |
| JP | 2008-085284 A | 4/2008 |
| JP | 2010-103440 A | 5/2010 |
| WO | 2009/098944 A1 | 8/2009 |
| WO | 2010/147095 A1 | 12/2010 |
| WO | 2011/040437 A1 | 4/2011 |

OTHER PUBLICATIONS

Written Opinion issued in Application No. PCT/JP2013/054630 dated May 7, 2013.

* cited by examiner

ESD PROTECTION DEVICE AND METHOD FOR PRODUCING THE SAME

BACKGROUND OF THE INVENTION

1. Field of the Invention

The present invention relates to an electrostatic discharge (ESD) protection device and a method for producing the same. In particular, the present invention relates to an improvement in a discharge auxiliary electrode provided for the purpose of accelerating electrostatic discharge in an ESD protection device.

2. Description of the Related Art

An overvoltage protection element that is interesting to the present invention is described in, for example, Japanese Unexamined Patent Application Publication No. 2008-85284 (Patent Document 1).

Patent Document 1 describes an overvoltage protection element material which is to become a discharge auxiliary electrode provided for the purpose of accelerating discharge. The material contains a non-conductor powder (for example, silicon carbide: particle size 1 to 50 μm) and a metal conductor powder (for example, copper: particle size 0.01 to 5 μm), and an adhesive (for example, glass powder).

In addition, Patent Document 1 describes a method for producing an overvoltage protection element, the method including a step of preparing a material paste by uniformly mixing a non-conductor powder, a metal conductor powder, and an adhesive at a particular ratio, a step of printing the material paste on a substrate, and a step of conducting a firing process (temperature: 300° C. to 1,200° C.) on the substrate.

However, the technology described in Patent Document 1 has the following problems to be solved.

First, since the surface of the metal conductor powder is exposed, exposed metal conductor particles are bound to each other during discharge, which may decrease insulation reliability. Furthermore, silicon carbide, which is used as a non-conductor powder, is a semiconductor having a relatively low insulation resistance, and thus it is difficult to improve insulation reliability.

For example, International Publication No. 2009/098944 pamphlet (Patent Document 2) describes a technology that can solve the problems described above.

Patent Document 2 describes the use of a discharge auxiliary electrode in which a conductive material (such as a Cu powder) coated with an inorganic material (such as $Al_2O_3$) is dispersed. According to the technology described in Patent Document 2, insulation reliability can be enhanced because the exposure of the conductive material is suppressed as compared with the technology described in Patent Document 1. Furthermore, even when the content of the conductive material is increased, short-circuit between particles of the conductive material does not easily occur. Thus, discharge occurs more easily by increasing the content of the conductive material. As a result, the peak voltage can be decreased.

However, the technology described in Patent Document 1 also has the following problems to be solved.

The "conductive material coated with an inorganic material" in the technology described in Patent Document 2 is merely a material obtained by coating the surface of a conductive material with fine particles composed of an inorganic material, as described in paragraphs [0034] and [0094] and FIG. 4 in Patent Document 2. Accordingly, it is relatively difficult to completely cover the surface of the conductive material with the inorganic material. Furthermore, even if the surface of a conductive material is completely covered with an inorganic material before the stage of firing, as shown in FIG. 12, when the conductive material 1 is thermally expanded during firing, the conductive material 1 is not completely covered with the inorganic material 2 and the conductive material 1 may be exposed after firing. Therefore, regarding insulation reliability, a further improvement has been desired.

Patent Document 1: Japanese Unexamined Patent Application Publication No. 2008-85284

Patent Document 2: International Publication No. 2009/098944 pamphlet

BRIEF SUMMARY OF THE INVENTION

Accordingly, an object of the present invention is to provide an ESD protection device which can solve the above problems, more specifically, which has high insulation reliability and good discharge characteristics, and a method for producing the ESD protection device.

First, the present invention provides an ESD protection device including a first discharge electrode and a second discharge electrode that are disposed so as to face each other, a discharge auxiliary electrode formed so as to span between the first discharge electrode and the second discharge electrode, and an insulator base that holds the first discharge electrode, the second discharge electrode, and the discharge auxiliary electrode. In order to solve the above technical problems, the discharge auxiliary electrode includes an aggregate of a plurality of metal particles each having a core-shell structure including a core portion that contains, as a main component, a first metal and a shell portion that contains, as a main component, a metal oxide containing a second metal, and a pore is present in at least part of the shell portion.

Since the metal particles that constitute the discharge auxiliary electrode are each completely or substantially completely covered with a shell portion containing a metal oxide as a main component in this manner, insulation reliability during discharge can be increased. In addition, since the shell portion has a pore, the shell portion has a small thickness in the periphery of the pore. Thus, discharge can be started by applying a relatively low ESD voltage.

The core portion preferably has a depression in the vicinity of the pore, the depression having a shape that receives the pore. Since the depression is present, electric charges are easily concentrated on the portion of the depression. Consequently, discharge easily occurs to improve discharge characteristics. In particular, a lower peak voltage can be realized.

The metal particles are preferably bound to each other with a glass-containing substance. In this case, degradation of peak voltage characteristics after a drop impact can be suppressed.

The shell portion preferably has a thickness of 50 to 1,500 nm. In this case, not only high insulation reliability but also good discharge characteristics, in particular, a lower peak voltage can be realized.

In a preferred embodiment, the second metal may be more susceptible to oxidation than the first metal. In this case, a plurality of metal particles each having a core-shell structure including a core portion containing, as a main component, the first metal and a shell portion containing, as a main component, a metal oxide that contains the second metal can be easily obtained by using the production method described below.

In the above embodiment, the first metal is preferably copper or a copper-based alloy containing copper as a main component. In this case, an ESD protection device can be provided at a relatively low cost. Furthermore, since copper has a relatively high melting point, insulation reliability during discharge can be further improved. This is because if the melting point is low, metal particles are melted and sintered by heat during discharge and short-circuit may occur.

In the above embodiment, the metal oxide containing the second metal is preferably at least one selected from aluminum oxide, silicon oxide, magnesium oxide, and nickel oxide. These oxides have high insulating properties, and thus insulation reliability during discharge can be further improved.

The core portion may contain not only the first metal but also the second metal as an auxiliary component.

In the case where the core portion contains the second metal, even when the shell portion is broken for any reason, the shell portion can be repaired by heat during discharge.

In the ESD protection device according to the present invention, the first discharge electrode, the second discharge electrode, and the discharge auxiliary electrode are preferably disposed inside the insulator base, and the insulator base preferably has a cavity for disposing a gap between the first discharge electrode and the second discharge electrode. The ESD protection device preferably further includes a first outer terminal electrode and a second outer terminal electrode that are formed on surfaces of the insulator base and that are respectively electrically connected to the first discharge electrode and the second discharge electrode. In this case, moisture resistance of the ESD protection device can be improved.

The present invention also provides a method for producing an ESD protection device.

A method for producing an ESD protection device according to the present invention includes the steps of preparing an alloy powder composed of an alloy containing a first metal and a second metal that is more susceptible to oxidation than the first metal; preparing an insulator base; forming an unfired discharge auxiliary electrode containing the alloy powder on the insulator base; forming, on the insulator base, a first discharge electrode and a second discharge electrode that are disposed so as to face each other with a predetermined gap therebetween on the discharge auxiliary electrode; and firing the unfired discharge auxiliary electrode.

The step of firing the unfired discharge auxiliary electrode includes the steps of, in each of alloy particles constituting the alloy powder, (1) conducting heat treatment in an atmosphere having an oxygen concentration at which the first metal is not oxidized and the second metal is oxidized in order to form a shell portion containing, as a main component, a metal oxide containing the second metal, the metal oxide being formed by moving the second metal toward the surface of the alloy particle and oxidizing the second metal at the time when the second metal reaches the surface, and to form a core portion containing, as a main component, the first metal that is left as a result of the movement of the second metal toward the surface of the alloy particle, (2) subsequently conducting heat treatment so as to join the core portion containing, as the main component, the first metal with the shell portion containing, as the main component, the metal oxide containing the second metal, and (3) subsequently decreasing a temperature to form a pore in the shell portion by shrinking the core portion containing, as the main component, the first metal more significantly than the shell portion containing, as the main component, the metal oxide containing the second metal.

Any of the step of forming the discharge auxiliary electrode and the step of forming the first discharge electrode and the second discharge electrode may be performed earlier.

The alloy powder is preferably produced by using an atomizing method. The composition of an alloy is easily controlled by employing an atomizing method. The inventor of the present invention has found that the thickness of the shell portion formed of a metal oxide containing the second metal can be controlled in the firing step by changing the composition ratio of the first metal and the second metal that constitute an alloy. It has also been found that the thickness of the shell portion formed of a metal oxide containing the second metal can be controlled by changing the particle size of metal particles that constitute an alloy powder.

In a preferred embodiment of the method for producing an ESD protection device according to the present invention, the step of preparing an insulator base may include a step of preparing a plurality of ceramic green sheets including a first ceramic green sheet and a second ceramic green sheet. In this case, the step of forming an unfired discharge auxiliary electrode and the step of forming a first discharge electrode and a second discharge electrode may be performed on the first ceramic green sheet. In this preferred embodiment, the method may further include the steps of forming a thermally removable layer so as to cover a gap between the first discharge electrode and the second discharge electrode; obtaining an unfired insulator base by stacking the second ceramic green sheet on the first ceramic green sheet so as to cover the unfired discharge auxiliary electrode, the first discharge electrode, the second discharge electrode, and the thermally removable layer; and forming, on surfaces of the insulator base, a first outer terminal electrode and a second outer terminal electrode that are respectively electrically connected to the first discharge electrode and the second discharge electrode. In the step of firing the unfired discharge auxiliary electrode, the insulator base is obtained by sintering the ceramic green sheets and the thermally removable layer is removed by being burnt away.

According to the ESD protection device of the present invention, metal particles that constitute a discharge auxiliary electrode are completely or substantially completely covered with a shell portion containing a metal oxide as a main component. Accordingly, even when a static electricity is repeatedly applied, degradation of characteristics does not easily occur and insulation reliability during discharge can be increased. In addition, even when the content of the metal particles is increased, short-circuit between the metal particles does not easily occur. Thus, discharge occurs more easily by increasing the content of the metal particles. Consequently, the peak voltage can be decreased.

Since the shell portion of the metal particles that constitute the discharge auxiliary electrode has a pore, the shell portion has a small thickness in the periphery of the pore. Thus, discharge can be started by applying a relatively low ESD voltage.

Accordingly, the ESD protection device of the present invention can be widely used for protecting various apparatuses or devices such as a semiconductor device.

According to the method for producing an ESD protection device of the present invention, in the firing step, heat treatment is conducted in an atmosphere having an oxygen concentration at which a first metal is not oxidized and a second metal is oxidized. By this heat treatment, in each of the metal particles that constitutes an alloy powder, the second metal is oxidized at the time when the second metal is precipitated on the surface of the metal particle. Consequently, a shell portion containing, as a main component, a metal oxide containing the second metal is formed, and a core portion formed of the first metal that is left as a result of the movement of the second metal toward the surface of the metal particle is formed. Therefore, a metal particle that is substantially completely covered with the shell portion containing the metal oxide as a main component can be easily obtained.

Furthermore, after the heat treatment, heat treatment for joining the core portion containing, as a main component, the first metal to the shell portion containing, as a main component, a metal oxide containing the second metal is further conducted. Subsequently, the temperature is decreased so as to form a pore in the shell portion by shrinking the core portion containing, as the main component, the first metal more significantly than the shell portion containing, as the main component, the metal oxide containing the second metal. Therefore, metal particles including a shell portion having a pore can be easily obtained.

DETAILED DESCRIPTION OF THE INVENTION

Figure 1:
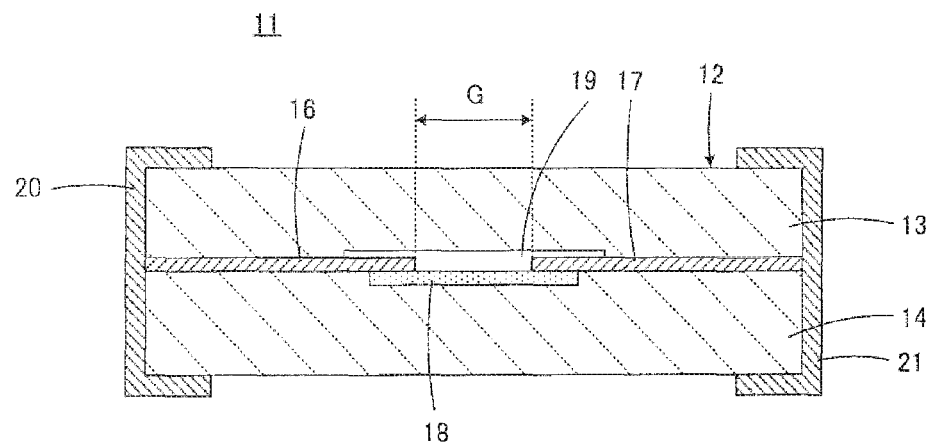
FIG. 1 is a cross-sectional view showing an ESD protection device 11 according to an embodiment of the present invention.

An ESD protection device 11 according to an embodiment of the present invention will be described with reference to FIG. 1.

An ESD protection device 11 includes an insulator base 12. The insulator base 12 is composed of a low-temperature co-fired ceramic (LTCC) such as a glass ceramic, a high-temperature co-fired ceramic (HTCC) such as aluminum nitride or alumina, or a magnetic ceramic such as ferrite. The insulator base 12 has a layered structure including at least an upper layer portion 13 and a lower layer portion 14.

A first discharge electrode 16 and a second discharge electrode 17 are provided inside the insulator base 12 and between the upper layer portion 13 and the lower layer portion 14. The first discharge electrode 16 and the second discharge electrode 17 are arranged so as to face each other with a predetermined gap G therebetween. A discharge auxiliary electrode 18 is also provided inside the insulator base 12 and between the upper layer portion 13 and the lower layer portion 14 so as to span between the first discharge electrode 16 and the second discharge electrode 17. The portion where the gap G in the insulator base 12 is located forms a cavity 19.

A first outer terminal electrode 20 and a second outer terminal electrode 21 are formed on outer surfaces of the insulator base 12. The first outer terminal electrode 20 and the second outer terminal electrode 21 are electrically connected to the first discharge electrode 16 and the second discharge electrode 17, respectively.

Figure 2:
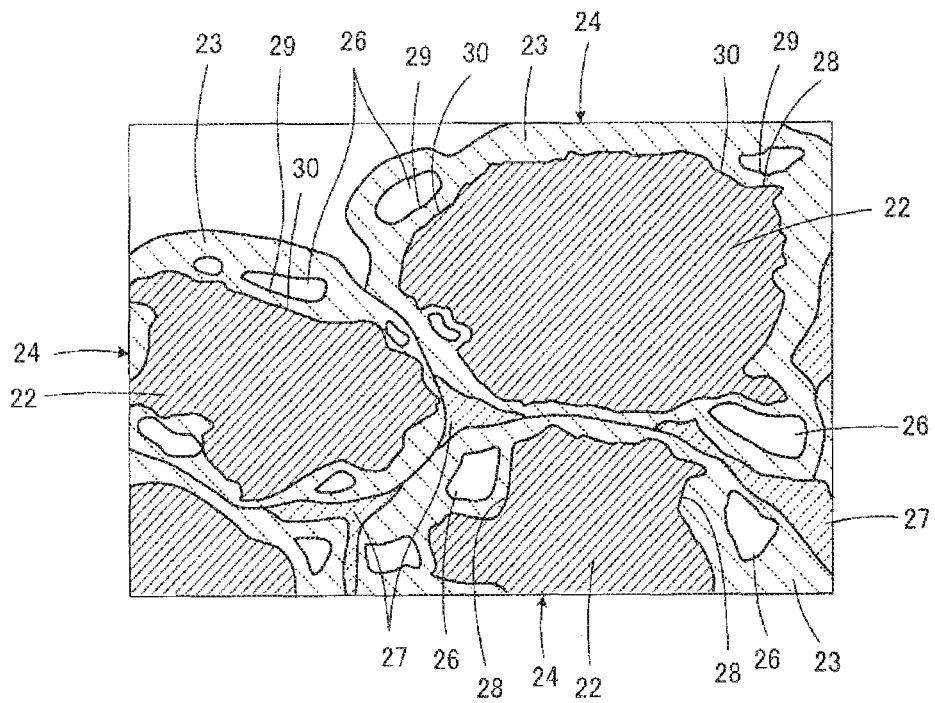
FIG. 2 is an enlarged cross-sectional view showing a plurality of metal particles 24 constituting a discharge auxiliary electrode 18 shown in FIG. 1.

In this ESD protection device 11, as shown in FIG. 2, the discharge auxiliary electrode 18 is constituted by an aggregate of a plurality of metal particles 24 having a core-shell structure including a core portion 22 containing, as a main component, a first metal and a shell portion 23 containing, as a main component, a metal oxide containing a second metal. In this manner, when the metal particles 24 constituting the discharge auxiliary electrode 18 each have a core-shell structure and are completely or substantially completely covered with the shell portion 23 containing a metal oxide as a main component, insulation reliability during discharge can be increased. It should be noted that the shell portion 23 is not in a state where fine particles are gathered but is formed in the form of a film, as shown in FIG. 2.

In the metal particles 24, a portion that is not covered with the shell portion 23 containing a metal oxide as a main component may be slightly present as long as the insulation reliability is not substantially impaired. It is defined that the "core-shell structure" in the present invention is achieved when a ratio L2/L1 is 75% or more where L1 represents the length of the entire circumference of the core portion 22 of a metal particle 24 and L2 represents the length of the circumference of the core portion 22 covered with the shell portion 23.

Pores 26 are formed in at least part of the shell portion 23. When the pores 26 are present in the shell portion 23 in this manner, the shell portion 23 has a small thickness in the periphery of the pores 26. Therefore, discharge can be started by applying a relatively low ESD voltage.

Preferably, in the core portion 22, a large number of portions each having a depression 28 with a shape that receives a pore 26 are present in the vicinity of pores 26. When the depression 28 is present, electric charges are easily concentrated on the portion of the depression 28. Consequently, discharge easily occurs to improve discharge characteristics. In particular, a lower peak voltage can be realized. In many positions, a wall surface 29 on the core portion 22 side, the wall surface 29 defining the pore 26, has a shape that is substantially along a wall surface 30 that defines the outer circumference of the core portion 22. This means that the pore 26 should be distinguished from a gap that is present between the metal particles 24.

In the discharge auxiliary electrode 18, the plurality of metal particles 24 are bound to each other with a glass-containing substance 27. With this structure, degradation of the peak voltage characteristics after drop impact can be suppressed.

A method for forming the pore 26 and a method for producing the glass-containing substance 27 will become clear in the description of a method for producing an ESD protection device 11 described below.

As is apparent from the experimental examples described below, the thickness of the shell portion is preferably 50 to 1,500 nm. In this case, not only high insulation reliability but also good discharge characteristics, in particular, a lower peak voltage can be realized. Probably, it is believed that when the thickness of the shell portion is less than 50 nm, the thickness of the insulating film is small, and thus the shell portion is partially broken by an impact generated at the time of the application of an ESD or the first metal component of the core portion is diffused into the shell portion, thereby degrading the insulating property of the shell portion. It is believed that when the thickness of the shell portion exceeds 1,500 nm, the thickness of the insulating film is large, and thus the amount of creeping discharge at the time of application of an ESD decreases.

When a metal that is more susceptible to oxidation than the first metal is used as the second metal, a plurality of the metal particles 24 having a core-shell structure including the core portion 22 containing, as a main component, the first metal and the shell portion 23 containing, as a main component, a metal oxide that contains the second metal can be easily obtained by using a production method described below.

For example, copper or a copper-based alloy containing copper as a main component is used as the first metal. When copper or a copper-based alloy is used as the first metal, for example, aluminum, nickel, bismuth, gallium, germanium, indium, magnesium, phosphorus, silicon, or tin can be used as the second metal. When copper or a copper-based alloy is used as the first metal and the discharge auxiliary electrode 18 is co-fired with the insulator base 12, the insulator base 12 is preferably composed of an LTCC.

Besides the above metals, silver, aluminum, molybdenum, tungsten, or the like can also be used as the first metal. In any case, a metal that is more susceptible to oxidation than the first metal is selected as the second metal.

As described above, a metal that is more susceptible to oxidation than the first metal is selected as the second metal. The metal oxide containing the second metal is particularly preferably at least one selected from aluminum oxide, silicon oxide, magnesium oxide, and nickel oxide. This is because these oxides have high insulating properties and thus insulation reliability during discharge can be further improved.

The ESD protection device 11 is produced, for example, as follows.

First, a plurality of ceramic green sheets which are to become an insulator base 12 are prepared. Among the plurality of ceramic green sheets, a first ceramic green sheet is used for forming, for example, a lower layer portion 14 of the insulator base 12, and a second ceramic green sheet is used for forming an upper layer portion 13 of the insulator base 12.

An alloy powder used for forming a discharge auxiliary electrode 18 and composed of an alloy containing a first metal and a second metal that is more susceptible to oxidation than the first metal is prepared. This alloy powder is preferably produced by an atomizing method. The composition of an alloy is easily controlled by the atomizing method.

Next, an unfired paste film which is to become the discharge auxiliary electrode 18 is formed on the first ceramic green sheet so as to have a predetermined pattern by using a paste containing the alloy powder. For example, SiC may be incorporated in the paste for forming the discharge auxiliary electrode 18 in a range that satisfies desired characteristics.

Next, a first discharge electrode 16 and a second discharge electrode 17 are formed on the paste film serving as the unfired discharge auxiliary electrode 18 on the first ceramic green sheet so as to face each other with a predetermined gap G therebetween. The discharge electrodes 16 and 17 are formed by, for example, applying a conductive paste.

Next, a thermally removable layer is formed so as to cover the gap G between the first discharge electrode 16 and the second discharge electrode 17. The thermally removable layer is a layer that is removed by being burnt away in a firing step described below to leave the cavity 19 inside the insulator base 12. The thermally removable layer is formed by, for example, using a paste containing resin beads.

The pastes used for forming the discharge auxiliary electrode 18, the first discharge electrode 16, the second discharge electrode 17, and the thermally removable layer may be applied either directly onto an object or by using a transfer method or the like.

Next, a second ceramic green sheet is stacked and pressure-bonded on the first ceramic green sheet so as to cover the unfired discharge auxiliary electrode 18, the first discharge electrode 16, the second discharge electrode 17, and the thermally removable layer. As a result, an unfired insulator base 12 is obtained.

Next, a first outer terminal electrode 20 and a second outer terminal electrode 21 are formed on surfaces of the unfired insulator base 12. The first outer terminal electrode 20 and the second outer terminal electrode 21 are formed by, for example, applying a conductive paste.

Next, a firing step is performed. As a result of this firing step, an insulator base 12 including sintered ceramic green sheets is obtained, and the discharge electrodes 16 and 17, the discharge auxiliary electrode 18, and the outer terminal electrodes 20 and 21 are sintered. Furthermore, the thermally removable layer is removed by being burnt away, and a cavity 19 is formed inside the insulator base 12.

An ESD protection device 11 is produced as described above.

In performing the firing step, when, in particular, the phenomenon that occurs in each of alloy particles constituting the alloy powder included in the discharge auxiliary electrode 18 is focused on, the firing step is divided into steps of three stages, namely, (1) a step of forming a core-shell structure, (2) a step of joining a core portion and a shell portion, and (3) a step of forming a pore in the shell portion. Each of the steps will be described in detail below. In this description, FIG. 9, which shows a firing profile used in the experimental examples described below, is referred to, as required.

(1) Step of Forming Core-Shell Structure

This step is performed in an atmosphere having an oxygen concentration at which the first metal contained in an alloy powder included in the unfired discharge auxiliary electrode 18 is not oxidized and the second metal is oxidized. This step corresponds to a temperature-increasing process shown in [A] of FIG. 9. A purpose of this step is, in each of alloy particles constituting an alloy powder, to form a core portion 22 containing, as a main component, a first metal by moving a second metal to the surface of the alloy particle and to form a shell portion 23 containing, as a main component, a metal oxide that contains the second metal by oxidizing the second metal at the time when the second metal reaches the surface.

Figure 3:
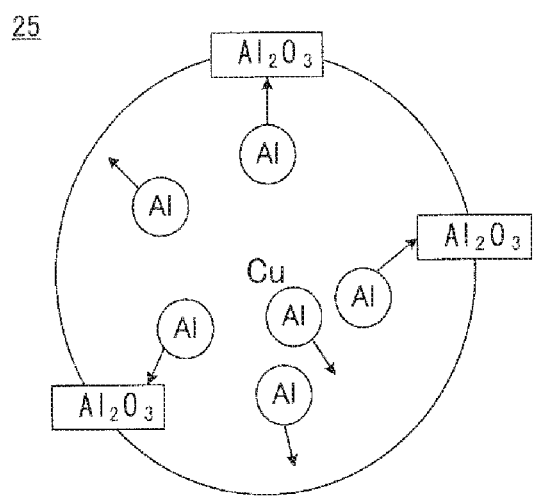
FIG. 3 is a cross-sectional view that schematically shows the behavior of aluminum (Al), which serves as a second metal generated in a firing step, in an alloy particle 25 prepared for obtaining a metal particle 24 shown in FIG. 2.

This step will be described more specifically with reference to FIG. 3 under the assumption that the first metal contained in the alloy is Cu and the second metal contained in the alloy is Al. FIG. 3 shows a single alloy particle 25 that forms an alloy powder.

Figure 9:
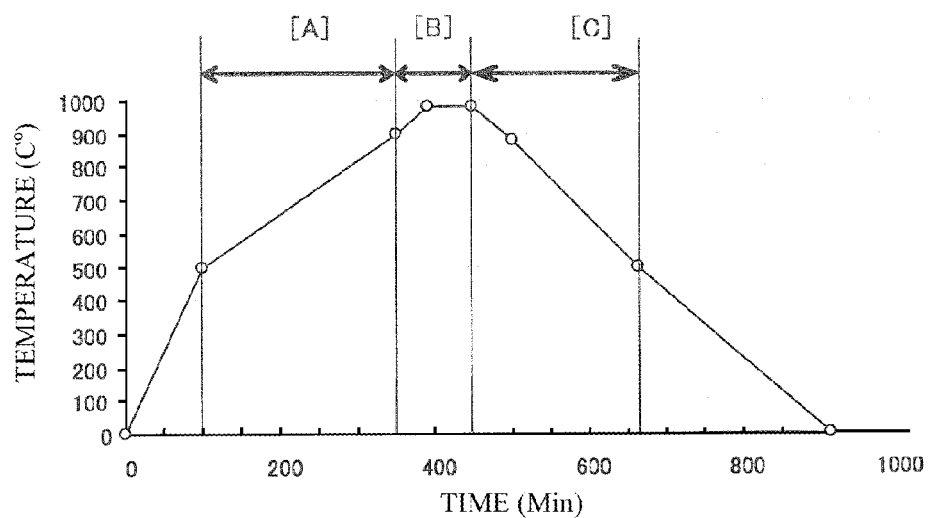
FIG. 9 is a graph showing a firing profile used in a firing step conducted after the step shown in FIG. 8 and in an experimental example.

When the firing step proceeds, in the temperature-increasing process shown in [A] of FIG. 9, Al in the alloy particle 25 containing Cu and Al moves toward the surface of the alloy particle 25, as shown by the arrows, oxidized at the time when the Al reaches the surface, and changed to $Al_2O_3$. Accordingly, a shell portion of the alloy particle 25 is formed by $Al_2O_3$. As is found from this phenomenon, Al which is the second metal may remain in the core portion of the alloy particle 25.

As described above, when the alloy powder is produced by using an atomizing method, the composition of the alloy is easily controlled. It has been found that, by changing the composition ratio of the first metal and the second metal that constitute the alloy, the thickness of the shell portion formed of a metal oxide containing the second metal can be controlled in the firing step. Accordingly, in order to obtain the preferable thickness of the shell portion, that is, 50 to 1,500 nm, for example, the composition of the first metal and the second metal is controlled. It has been also found that, by changing the particle size of the alloy particle 25, the thickness of the shell portion formed of a metal oxide containing the second metal can be controlled.

The temperature in this step is not particularly limited, but the step is preferably performed in the range of 500° C. to 900° C. At a temperature lower than 500° C., the movement of the second metal component to the surface of an alloy particle is slow, and a shell portion having a sufficient thickness and sufficient uniformity may not be formed. On the other hand, at a temperature higher than 900° C., the movement of the second metal component to the surface of an alloy particle becomes nonuniform, and a shell having a sufficient thickness and sufficient uniformity may not be formed.

The oxygen concentration in this step is set to a value at which the first metal component contained in the alloy particle is not oxidized and the second metal component is oxidized. The oxygen concentration is not particularly limited as long as this condition is satisfied. The oxygen concentration may be adjusted by, for example, mixing of $H_2/H_2O/N_2$.

When the oxygen concentration is set to a value at which the first metal component is oxidized, the first metal component itself is oxidized and the movement of the second metal component to the surface of an alloy particle is inhibited. Consequently, a shell having a sufficient thickness and sufficient uniformity may not be formed. On the other hand, when the oxygen concentration is set to a value at which both the first metal component and the second metal component are not oxidized, a shell having a sufficient thickness and sufficient uniformity may not be formed.

The holding time in this step is preferably set to at least 30 to 800 minutes in the range of 500° C. to 900° C. When the holding time is shorter than 30 minutes, the movement of the second metal component to the surface of an alloy particle is insufficient, and a shell having a sufficient thickness and sufficient uniformity may not be formed. When the holding time is longer than 800 minutes, productivity significantly decreases.

(2) Step of Joining Core Portion and Shell Portion

This step corresponds to a maximum temperature-maintaining process shown in [B] of FIG. 9. A purpose of this step is to join a core potion containing, as a main component, the first metal to a shell portion containing, as a main component, a metal oxide that contains the second metal.

The temperature in this step is not particularly limited. However, it is necessary to perform this step at a temperature lower than the melting point of the first metal component. When the temperature in this step is set to a temperature equal to or higher than the melting point of the first metal component, the core portion is melted and the core-shell structure is thereby broken. Consequently, the ESD protection characteristics cannot be ensured.

The oxygen concentration in this step is preferably an oxygen concentration at which the second metal component is not reduced. More preferably, the oxygen concentration is set to a value at which the first metal component is not oxidized and the second metal component is oxidized. When the oxygen concentration is set to a value at which the second metal component is reduced, the shell portion is broken and the ESD protection characteristics are degraded. When the oxygen concentration is set to a value at which the first metal component is not oxidized and the second metal component is not reduced, the core portion and the shell portion are joined to each other, and oxide particles in the shell portion are moderately sintered to each other and thus a shell having a pore is easily formed in the subsequent step of forming a pore in the shell portion. The oxygen concentration may be adjusted by, for example, mixing of $H_2/H_2O/N_2$.

The holding time in this step is preferably set to 10 to 300 minutes. When the holding time is shorter than 10 minutes, the joining of the core portion and the shell portion may not be ensured. When the holding time is longer than 300 minutes, metal oxide particles in the shell portion are excessively sintered to each other and thus a shell having a pore is not easily formed in the subsequent step of forming a pore in the shell portion.

(3) Step of Forming Pore in Shell Portion

This step corresponds to a temperature-decreasing process shown in [C] of FIG. 9. A purpose of this step is to form a shell portion having a pore. In general, a metal has a thermal expansion coefficient that is larger than that of an oxide. In this step, the core portion containing a metal as a main component is shrunk more significantly than the shell portion containing an oxide as a main component by utilizing this property. In this case, only a part of the shell portion, the part joining to the core portion, shrinks in a state where the part of the shell portion is joined to the core portion. Accordingly, a structural break occurs in the shell portion. As a result, a pore is generated in the shell portion.

The temperature in this step is not particularly limited as long as the temperature is lower than the temperature in the (2) step of joining a core portion and a shell portion described above. Preferably, the temperature is lower than the temperature in the (2) step of joining a core portion and a shell portion by 100° C. or more. When the difference in the temperature is less than 100° C., the amount of shrinkage of the core portion is small and thus a pore having a sufficient size may not be formed.

The oxygen concentration in this step is preferably set to a value at which the second metal component is not reduced. More preferably, the oxygen concentration is set to a value at which the first metal component is not oxidized and the second metal component is oxidized. When the oxygen concentration is set to a value at which the second metal component is reduced, the shell portion may be broken and the ESD protection characteristics are degraded. When the oxygen concentration is set to a value at which both the first metal component and the second metal component are oxidized, oxygen molecules pass through the shell portion to oxidize the first metal component. Consequently, the shell portion may be broken by the oxidation expansion of the first metal component. When the oxygen concentration is set to a value at which the first metal component is not oxidized and the second metal component is not reduced, a shell having a pore is easily formed. The oxygen concentration may be adjusted by, for example, mixing of $H_2/H_2O/N_2$.

The holding time in this step is preferably set to 30 minutes or longer. When the holding time is shorter than 30 minutes, it tends to become difficult to form a shell portion having a pore.

As a result of the firing step described above, preferably, a state where a plurality of metal particles 24 are bound to each other with a glass-containing substance 27 is obtained in the discharge auxiliary electrode 18. This glass-containing substance 27 is generated, for example, as follows.

Specifically, in the case where the insulator base 12 contains a glass-containing substance, for example, in the case where the insulator base 12 is composed of a low-temperature co-fired ceramic (LTCC) such as a glass ceramic, in the firing step, the glass-containing substance 27 is diffused into the discharge auxiliary electrode 18 so as to form a state where the plurality of metal particles 24 are bound to each other with the glass-containing substance 27.

Instead of the above method or in addition to the above method, at least one of the methods described below may be employed.

The state where the plurality of metal particles 24 are bound to each other with the glass-containing substance 27 can be obtained by employing, for example, a method in which glass itself is incorporated in the unfired discharge auxiliary electrode 18 in advance, a method in which a substance that generates glass during firing is incorporated in the unfired discharge auxiliary electrode 18 in advance, a method in which glass is generated by a reaction with the shell portion 23 during firing, or a method in which part of an oxide containing the second metal, the oxide serving as a main component of the shell portion 23, is changed to an amorphous component during firing.

Furthermore, modifications described below may be made within the scope of the present invention.

In the embodiment shown in the figure, the discharge electrodes 16 and 17 and the discharge auxiliary electrode 18 are disposed inside the insulator base 12. Alternatively, the discharge electrodes 16 and 17 and the discharge auxiliary electrode 18 may be disposed on an outer surface of an insulator base.

Even in the case where the discharge electrodes 16 and 17 and the discharge auxiliary electrode 18 are disposed inside the insulator base 12, the cavity 19 is not necessarily formed.

In the production method described above, the firing for sintering the discharge electrodes 16 and 17 and the discharge auxiliary electrode 18 and the firing for sintering the insulator base 12 are performed at the same time. Alternatively, an insulator base composed of a sintered ceramic may be prepared in advance, and discharge electrodes and a discharge auxiliary electrode may be formed on the insulator base.

Next, experimental examples that were conducted in order to confirm the effects of the present invention will be described.

Experimental Example 1

Preparation of Evaluation Samples (1) Preparation of Ceramic Green Sheets

Materials containing Ba, Al, and Si as main components were prepared as ceramic materials. The materials were mixed so as to have a predetermined composition, and calcined at 800° C. to 1,000° C. The resulting calcined powder was pulverized with a zirconia ball mill for 12 hours to prepare a ceramic powder.

Next, an organic solvent containing toluene and Ekinen was added to the ceramic powder, and the organic solvent and the powder were mixed. Subsequently, a binder and a plasticizer were further added thereto, and the resulting mixture was again mixed to prepare a slurry.

Next, the slurry was formed by a doctor blade method to prepare ceramic green sheets each having a thickness of 50 μm. One of the ceramic green sheets prepared in this step is shown as a ceramic green sheet 31 in FIGS. 4 to 8, and another one of the ceramic green sheets is shown as a ceramic green sheet 36 in FIGS. 7 and 8.

(2) Preparation of Paste for Discharge Auxiliary Electrode

TABLE 1

| Paste symbol | Type of metal | Composition (mol %) | | | Particle size distribution (μm) | | |
|---|---|---|---|---|---|---|---|
| | | Cu | Al | Ni | D10 | D50 | D90 |
| P-1 | Cu—Al-based alloy | 95 | 5 | — | 1.2 | 2.5 | 5.4 |
| P-2 | Cu—Al-based alloy | 80 | 20 | — | 1.2 | 2.5 | 5.4 |
| P-3 | Cu—Al-based alloy | 60 | 40 | — | 1.2 | 2.5 | 5.1 |
| P-4 | Cu—Al-based alloy | 90 | 10 | — | 0.8 | 1.3 | 2.6 |
| P-5 | Cu—Al-based alloy | 50 | 50 | — | 0.8 | 1.3 | 2.6 |
| P-6 | Cu—Al-based alloy | 63 | — | 37 | 1.2 | 2.5 | 5.2 |
| P-7 | Cu-based | 100 | — | — | 1.2 | 2.3 | 5.4 |

Pastes P-1 to P-7 for discharge auxiliary electrodes, the pastes containing the metal powders shown in Table 1, were prepared.

More specifically, each of the metal powders composed of an alloy or a metal shown in the column of "type of metal" in Table 1 was prepared by an atomizing method. The "particle size distribution" shown in Table 1 was determined by a laser diffraction particle size distribution method. The "composition" shown in Table 1 was determined by an inductively coupled plasma atomic emission spectrometry (ICP-AES).

An organic vehicle was prepared by dissolving an Ethocel resin having a weight-average molecular weight of $5 \times 10^4$ and an alkyd resin having a weight-average molecular weight of $8 \times 10^3$ in terpineol. In the organic vehicle, the content of the Ethocel resin was 9.0% by weight, the content of the alkyd resin was 4.5% by weight, and the content of terpineol was 86.5% by weight.

Next, the metal powder and the organic vehicle were prepared so that the volume ratio was 14:86, and the resulting mixture was subjected to a dispersion treatment with a three-roll mill. Thus, the pastes P-1 to P-7 for discharge auxiliary electrodes were prepared.

TABLE 2

| Paste symbol | Type of metal | Composition (wt %) | | Particle size distribution (μm) | | |
|---|---|---|---|---|---|---|
| | | Cu | $Al_2O_3$ | D10 | D50 | D90 |
| P-8 | Cu coated with $Al_2O_3$-based | 95 | 5 | 2.3 | 2.8 | 3.9 |

In addition, a paste P-8 for a discharge auxiliary electrode was prepared as a comparative example as follows. As shown in the column of "type of metal" in Table 2, a metal powder obtained by coating a copper powder, which was prepared by a wet synthesis method, with a nano-sized alumina powder by a mechano-fusion method was prepared. This metal powder and an organic vehicle the same as that used in the pastes shown in Table 1 were prepared so that the volume ratio was 14:86, and the resulting mixture was subjected to a dispersion treatment with a three-roll mill. Thus, the paste P-8 for a discharge auxiliary electrode was prepared.

The "particle size distribution" and the "composition" shown in Table 2 were determined by the same methods as those used in the pastes shown in Table 1.

(3) Preparation of Paste for Discharge Electrode

First, 40% by weight of a Cu powder having an average particle size of 1 μm, 40% by weight of a Cu powder having an average particle size of 3 μm, and 20% by weight of an organic vehicle prepared by dissolving ethyl cellulose in terpineol were prepared, and the resulting mixture was mixed with a three-roll mill. Thus, a paste for a discharge electrode was prepared.

(4) Preparation of Resin Beads Paste for Thermally Removable Layer

A resin beads paste was prepared in order to form a thermally removable layer that is removed by being burnt away during firing to become a cavity. First, 38% by weight of cross-linked acrylic resin beads having an average particle size of 1 μm and 62% by weight of an organic vehicle prepared by dissolving ethyl cellulose in dihydro terpinyl acetate were prepared, and the resulting mixture was mixed with a three-roll mill. Thus, a resin beads paste for a thermally removable layer was prepared.

(5) Preparation of Paste for Outer Terminal Electrode

First, 80% by weight of a Cu powder having an average particle size of about 1 μm, 5% by weight of alkali borosilicate glass frit having a transition point of 620° C. and a softening point of 720° C. and an average particle size of about 1 μm, and 15% by weight of an organic vehicle prepared by dissolving ethyl cellulose in terpineol were prepared, and the resulting mixture was mixed with a three-roll mill. Thus, a paste for an outer terminal electrode was prepared.

(6) Printing of Each Paste

Figure 4:
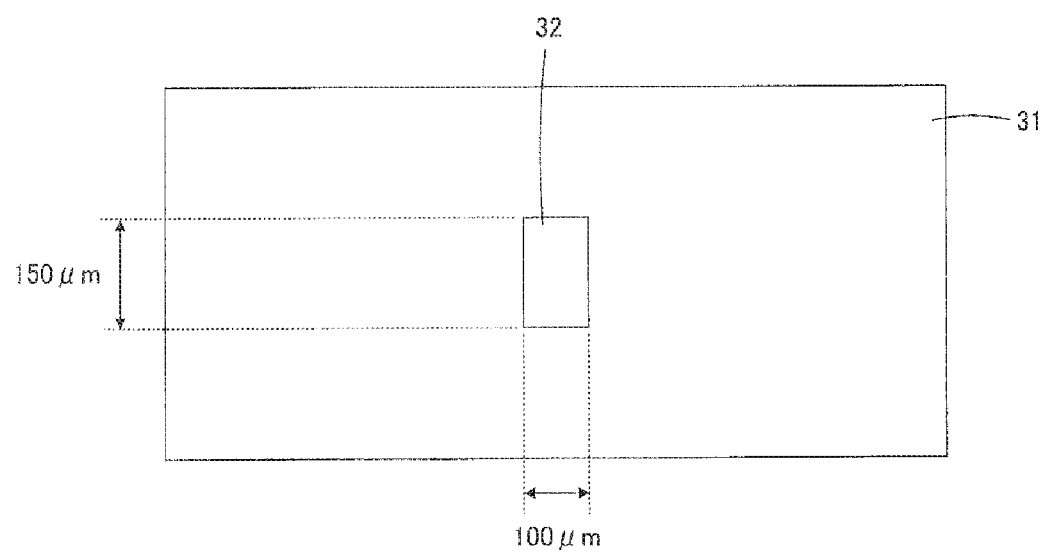
FIG. 4 illustrates a step of producing an ESD protection device 42 prepared in an experimental example and is a plan view showing a state where an unfired discharge auxiliary electrode 32 is formed on a first ceramic green sheet 31.

First, as shown in FIG. 4, a paste for a discharge auxiliary electrode was applied onto a main surface of a ceramic green sheet 31 to form an unfired discharge auxiliary electrode 32 having dimensions of 150 μm×100 μm. In this step, as the paste for a discharge auxiliary electrode, one of the pastes P-1 to P-8 for discharge auxiliary electrodes shown in Tables 1 and 2 was used as shown in the column of "symbol of paste for discharge auxiliary electrode" in Tables 3 and 4.

Figure 5:
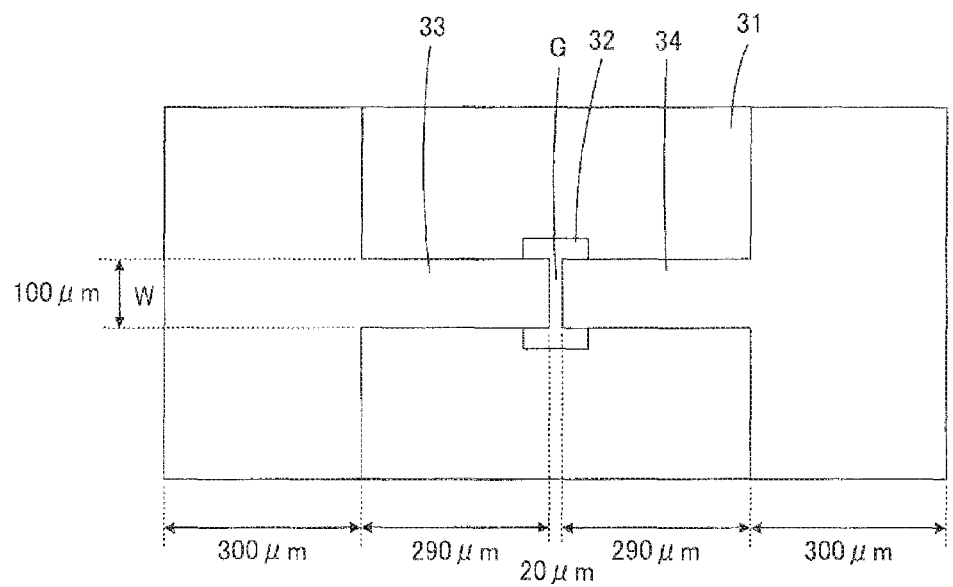
FIG. 5 illustrates a step of producing an ESD protection device 42 prepared in an experimental example and is a plan view showing a state where, after the step shown in FIG. 4, an unfired first discharge electrode 33 and an unfired second discharge electrode 34 are formed.

Subsequently, the paste for a discharge electrode was applied onto the main surface of the ceramic green sheet 31 so as to partially overlap with the unfired discharge auxiliary electrode 32. Thus, an unfired first discharge electrode 33 and an unfired second discharge electrode 34 were formed as shown in FIG. 5. The unfired first discharge electrode 33 and the unfired second discharge electrode 34 face each other with a gap G of 20 μm therebetween on the unfired discharge auxiliary electrode 32. A width W of the facing portion was 100 μm. Dimensions of other portions are also shown in FIG. 5.

Figure 6:
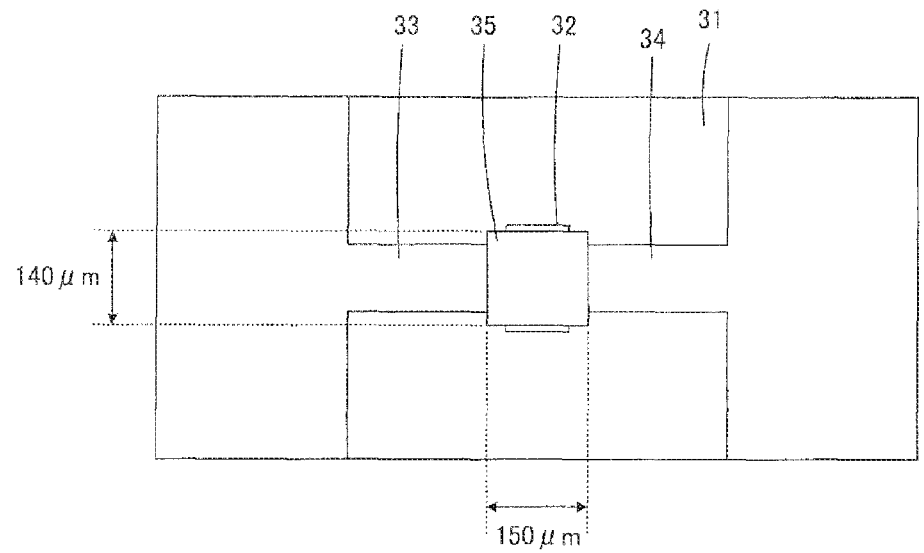
FIG. 6 illustrates a step of producing an ESD protection device 42 prepared in an experimental example and is a plan view showing a state where, after the step shown in FIG. 5, an unfired thermally removable layer 35 is formed.

Next, as shown in FIG. 6, the resin beads paste for a thermally removable layer was applied so as to cover the gap G between the unfired first discharge electrode 33 and the unfired second discharge electrode 34. Thus, an unfired thermally removable layer 35 having dimensions of 140 μm×150 μm was formed.

(7) Stacking and Pressure-Bonding

Figure 7:
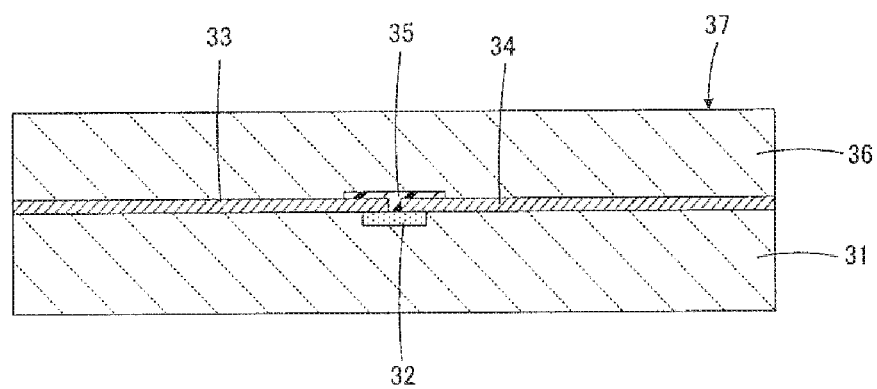
FIG. 7 illustrates a step of producing an ESD protection device 42 prepared in an experimental example and is a cross-sectional view showing a state where, after the step shown in FIG. 6, a second ceramic green sheet 36 is stacked.

As shown in FIG. 7, a plurality of second ceramic green sheets 36 onto which no paste was applied were stacked and pressure-bonded on the main surface of the first ceramic green sheet 31 on which the unfired discharge auxiliary electrode 32, the unfired discharge electrodes 33 and 34, and the unfired thermally removable layer 35 were formed as described above. Thus, an unfired insulator base 37 was prepared. The insulator base 37 was formed so as to have a thickness after firing of 0.3 mm.

(8) Cutting and Printing of Paste for Outer Electrode

The insulator base 37 was cut with a micro-cutter so as to have planar dimensions of 1.0 mm×0.5 mm after firing. It should be understood that the dimensions shown in FIG. 5 and the outer shapes of the ceramic green sheet 31 etc. shown in FIGS. 4 to 7 are dimensions and shapes after this cutting step.

Figure 8:
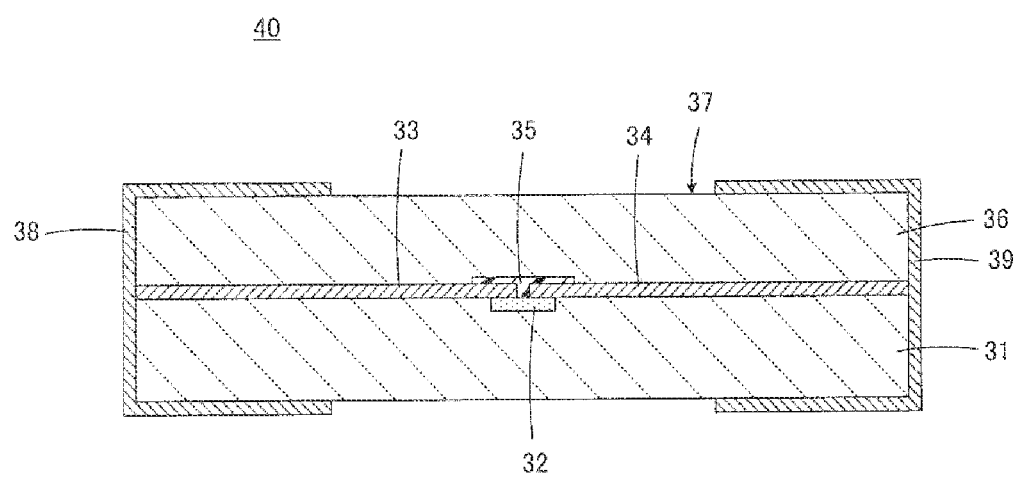
FIG. 8 illustrates a step of producing an ESD protection device 42 prepared in an experimental example and is a cross-sectional view showing a state where, after the step shown in FIG. 7, unfired outer terminal electrodes 38 and 39 are formed.

Subsequently, as shown in FIG. 8, the paste for an outer electrode was applied onto outer surfaces of the insulator base 37, thereby forming an unfired first outer terminal electrode 38 and an unfired second outer terminal electrode 39 that were respectively connected to the first discharge electrode 33 and the second discharge electrode 34. Thus, an unfired ESD protection device 40 was prepared.

(9) Firing

Figure 10:
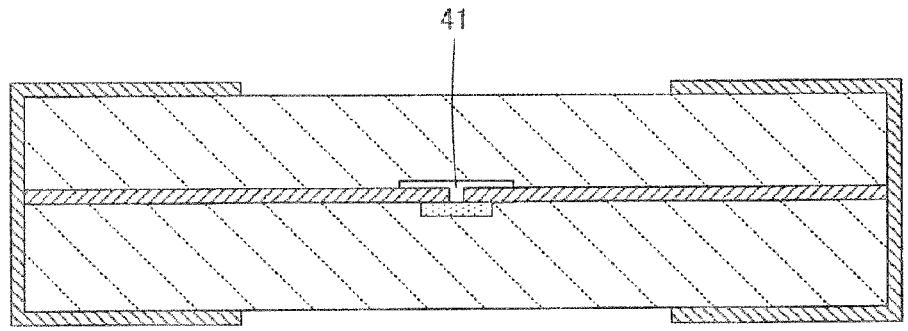
FIG. 10 is a cross-sectional view showing a completed ESD protection device 42 produced by conducting the firing step in an experimental example.

The unfired ESD protection device 40 was fired with the firing profile shown in FIG. 9 to obtain an ESD protection device 42 having a cavity portion 41 and shown in FIG. 10.

In the firing, the atmosphere in a firing furnace was controlled by changing the ratio of $N_2/H_2/H_2O$ such that the oxygen concentrations in the [A] step of forming a core-shell structure, the [B] step of joining a core portion and a shell portion, and the [C] step of forming a pore in a shell portion shown in FIG. 9 became oxygen concentrations at which a metal or an oxide shown in each of the columns of [A], [B], and [C] in the "firing condition" of Tables 3 and 4 was in a stable state.

Sample 1 will be described as an example. In the [A]"step of forming core-shell structure", the oxygen concentration is set to a value at which Cu is stable in the state of "Cu" and Al is stable in the state of "$Al_2O_3$". In the [B]"step of joining core portion and shell portion", the oxygen concentration is set to a value at which Cu is stable in the state of "Cu" and Al is stable in the state of "$Al_2O_3$". In the [C]"step of forming pore in shell portion", the oxygen concentration is set to a value at which Cu is stable in the state of "Cu" and Al is stable in the state of "$Al_2O_3$".

An oxygen partial pressure at which each metal used in the discharge auxiliary electrode is oxidized at a temperature T (K) was calculated by the following formulae.

$$*\ln(Cu_{PO2}) > \{-338904 + (-33 T\log T) + 247T\}/(8.314T)$$

$$*\ln(Al_{PO2}) > \{-1117993 + (-11 T\log T) + 244T\}/(8.314T)$$

$$*\ln(Ni_{PO2}) > \{-489110 + 197T\}/(8.314T)$$

<Characteristic Evaluation>

Next, characteristics of the ESD protection device samples prepared as described above were examined by the methods described below.

(1) Structural Characteristics of Metal Particles Contained in Discharge Auxiliary Electrode Each of the ESD protection devices was embedded in an epoxy resin, and the epoxy resin was cured. After curing, an LT surface defined by a side extending in a longitudinal direction and a side extending in a thickness direction was exposed by polishing. The polishing was performed until a surface at a position located halfway through in a width direction was exposed. Subsequently, a focused ion beam (FIB) process was performed on a discharge auxiliary electrode exposed by the polishing.

For the discharge auxiliary electrode sampled by the FIB process, observation with a scanning transmission electron microscope (STEM) and analysis of metals and oxygen with an energy-dispersive X-ray spectrometer (EDS) were conducted. The STEM observation was conducted with an accelerating voltage of 5 kV at a magnification of 5,000 and 25,000. From the STEM observation and the EDS analysis, whether or not metal particles in the discharge auxiliary electrode were core-shell structured metal particles having a shell portion composed of a metal oxide, whether or not metal particles in the discharge auxiliary electrode had pores in a shell portion, and whether or not core-shell structured metal particles were bound to each other with a glass-containing substance were determined for metal particles in the discharge auxiliary electrode.

In the column of "core-shell structure" in Tables 3 and 4, a sample in which a shell portion composed of a metal oxide was observed is denoted by "○", and a sample in which a shell portion composed of a metal oxide was not observed is denoted by "x". The criteria of "○" and "x" as to the "core-shell structure" were defined as described above. Specifically, when the length of the entire circumference of the core portion of a metal particle is represented by L1 and the length of the circumference of the core portion covered with the shell portion is represented by L2, a sample having a ratio L2/L1 of 75% or more is determined as "○" and a sample having a ratio L2/L1 of less than 75% is determined as "x".

For samples in which a shell portion composed of a metal oxide was observed, the presence or absence of a pore in the shell portion was examined, the type of metal oxide was analyzed, and the thickness of the shell portion was calculated by image analysis. These results are respectively shown in the columns of "presence or absence of pore", "type of metal oxide", and "thickness" in the "shell portion" in Tables 3 and 4. Regarding the "presence or absence of pore", in the field of view of the SEM observation, when a pore in a shell portion was observed in at least two metal particles, it is determined that a pore is present and this result is denoted by "○". Referring to the column of "presence or absence of pore", it is found that a pore was present in all samples in which a shell portion was observed.

Furthermore, whether or not a plurality of metal particles in the discharge auxiliary electrode were bound to each other with a glass-containing substance was examined. Specifically, a joined portion that was present between a specific metal particle and a metal particle adjacent to the specific metal particle was analyzed with an electron diffractograph. When an electron diffraction pattern was not observed, it was determined that the metal particles were bound to each other with a glass-containing substance. In the column of "binding property with glass-containing substance" in Tables 3 and 4, when it was determined that the metal particles were bound to each other with a glass-containing substance, this result is denoted by "○". When it was determined that the metal particles were not bound to each other with a glass-containing substance, this result is denoted by "x".

In Tables 3 and 4, for all samples, "○" is inserted in the column of "presence or absence of glass-containing substance". Symbol "x" appears in Table 5 below.

(2) Initial Short-Circuit Characteristics

An insulation resistance was measured by applying a DC voltage of 50 V between the outer terminal electrodes of each of the ESD protection device samples. When the insulation resistance was $10^8 \Omega$ or more, it was determined that initial short-circuit characteristics were good. This result is denoted by "○" in the column of "initial short-circuit" in Tables 3 and 4. When the insulation resistance was less than $10^8 \Omega$, it was determined that initial short-circuit characteristics were not good. This result is denoted by "x" in the column of "initial short-circuit".

Regarding ESD protection devices whose initial short-circuit characteristics were not good, it was determined that the ESD protection devices could not be provided for practical use, and subsequent characteristic evaluations (short-circuit resistance, peak voltage characteristics, and peak voltage characteristics after drop impact) were not performed.

(3) Short-Circuit Resistance

For each of the ESD protection device samples, application of 0.2 kV 10 times→application of 0.4 kV 10 times→application of 0.6 kV 10 times→application of 1 kV 10 times→application of 2 kV 10 times→application of 4 kV 10 times were sequentially performed. The insulation resistance of the sample was measured in each application. When a measured resistance of less than $10^6 \Omega$ was not obtained even once, it was determined that short-circuit resistance was good. This result is denoted by "○" in the column of "short-circuit resistance". When a resistance of less than $10^6 \Omega$ was measured at least once, it was determined that short-circuit resistance was not good. This result is denoted by "x" in the column of "short-circuit resistance".

(4) Peak Voltage Characteristics

A static electricity of 8 kV was applied to each of the ESD protection device samples by using an electrostatic test gun. A voltage measured with an oscilloscope at that time was defined as a peak voltage ($V_{peak1}$). When the peak voltage ($V_{peak1}$) was less than 400 V, it was determined that peak voltage characteristics were excellent. This result is denoted by "⊙" in the column of "peak voltage" in Tables 3 and 4. When the peak voltage ($V_{peak1}$) was 400 V or more and less than 700 V, it was determined that peak voltage characteristics were better. This result is denoted by "○" in the column of "peak voltage". When the peak voltage ($V_{peak1}$) was 700 V or more, it was determined that peak voltage characteristics were not good. This result is denoted by "x" in the column of "peak voltage".

In Tables 3 and 4, regarding the "peak voltage", no sample was determined as "⊙".

(5) Peak Voltage Characteristics after Drop Impact

For the ESD protection device samples which were determined that the peak voltage characteristics are good, each of the samples was vertically dropped from a height of 1.8 m 50 times. Subsequently, as in the case of the measurement of the peak voltage ($V_{peak1}$), a static electricity of 8 kV was applied to the ESD protection device sample by using an electrostatic test gun, and a voltage measured with an oscilloscope at that time was defined as a peak voltage ($V_{peak2}$) after drop impact.

A ratio $V_{peak2}/V_{peak1}$ of this $V_{peak2}$ to the $V_{peak1}$ was determined. When the relationship "$1.00 \leq V_{peak2}/V_{peak1} \leq 1.25$" was satisfied, it was determined that the peak voltage characteristics after drop impact were excellent, and "⊙" is inserted in the column of "peak voltage after drop impact" in Tables 3 and 4. When the relationship "$1.25 < V_{peak2}/V_{peak1} \leq 1.50$" was satisfied, it was determined that the peak voltage characteristics after drop impact were better, and "○" is inserted in the column of "peak voltage after drop impact". When the relationship "$V_{peak2}/V_{peak1} > 1.50$" was satisfied, it was determined that the peak voltage characteristics after drop impact were degraded, and "x" is inserted in the column of "peak voltage after drop impact".

In Tables 3 and 4, there is no sample for which "⊙" is inserted in the column of "peak voltage after drop impact". Symbol "⊙" appears in Table 5 below.

(6) Comprehensive Evaluation

In the evaluations of the "initial short-circuit", the "short-circuit resistance", the "peak voltage", and the "peak voltage after drop impact", among samples evaluated as "○" in the "initial short-circuit" and the "short-circuit resistance", for samples evaluated as "⊙" in both the "peak voltage" and the "peak voltage after drop impact", "⊙" is inserted in the column of "comprehensive evaluation" in Tables 3 and 4, and for samples evaluated as "⊙" in one of the "peak voltage" and the "peak voltage after drop impact" and "○" in the other, "○" is inserted in the column of "comprehensive evaluation". In the evaluations of the "initial short-circuit", the "short-circuit resistance", the "peak voltage", and the "peak voltage after drop impact", for samples evaluated as "x" in at least one of these evaluation items, "x" is inserted in the column of "comprehensive evaluation".

In Tables 3 and 4, there is no sample for which "○" is inserted in the column of "comprehensive evaluation". Symbol "○" appears in Table 5 below.

TABLE 3

| | | Firing condition | | | Characteristic evaluation | | | |
| | | [A] | [B] | [C] | | Shell portion | | |
| Sample No. | Symbol of paste for discharge auxiliary electrode | Step of forming core-shell structure | Step of joining core portion and shell portion | Step of forming pore in shell portion | Core-shell structure | Presence or absence of pore | Type of metal oxide | Thickness (μm) |
|---|---|---|---|---|---|---|---|---|
| 1 | P-1 | Cu Al$_2$O$_3$ | Cu Al$_2$O$_3$ | Cu Al$_2$O$_3$ | ○ | ○ | Al$_2$O$_3$ | 50 to 300 |
| 2 | P-1 | Cu Al$_2$O$_3$ | Cu Al$_2$O$_3$ | Cu$_2$O Al$_2$O$_3$ | ○ | ○ | Al$_2$O$_3$ | 50 to 300 |
| 3 | P-1 | Cu Al$_2$O$_3$ | Cu$_2$O Al$_2$O$_3$ | Cu Al$_2$O$_3$ | ○ | ○ | Al$_2$O$_3$ | 50 to 300 |
| 4 | P-1 | Cu Al$_2$O$_3$ | Cu$_2$O Al$_2$O$_3$ | Cu$_2$O Al$_2$O$_3$ | ○ | ○ | Al$_2$O$_3$ | 50 to 300 |
| *5 | P-1 | Cu$_2$O Al$_2$O$_3$ | Cu$_2$O Al$_2$O$_3$ | Cu$_2$O Al$_2$O$_3$ | X | — | — | — |
| 6 | P-2 | Cu Al$_2$O$_3$ | Cu Al$_2$O$_3$ | Cu Al$_2$O$_3$ | ○ | ○ | Al$_2$O$_3$ | 100 to 1000 |
| 7 | P-3 | Cu Al$_2$O$_3$ | Cu Al$_2$O$_3$ | Cu Al$_2$O$_3$ | ○ | ○ | Al$_2$O$_3$ | 200 to 1500 |
| 8 | P-4 | Cu Al$_2$O$_3$ | Cu Al$_2$O$_3$ | Cu Al$_2$O$_3$ | ○ | ○ | Al$_2$O$_3$ | 20 to 150 |
| 9 | P-5 | Cu Al$_2$O$_3$ | Cu Al$_2$O$_3$ | Cu Al$_2$O$_3$ | ○ | ○ | Al$_2$O$_3$ | 100 to 1000 |
| 10 | P-6 | Cu NiO | Cu NiO | Cu NiO | ○ | ○ | NiO | 100 to 1000 |
| 11 | P-6 | Cu NiO | Cu NiO | Cu$_2$O NiO | ○ | ○ | NiO | 100 to 1000 |
| 12 | P-6 | Cu NiO | Cu$_2$O NiO | Cu NiO | ○ | ○ | NiO | 100 to 1000 |
| 13 | P-6 | Cu NiO | Cu$_2$O NiO | Cu$_2$O NiO | ○ | ○ | NiO | 100 to 1000 |

| Sample No. | Presence or absence of glass-containing substance | Initial short-circuit | Short-circuit resistance | Peak voltage | Peak voltage after drop impact | Comprehensive evaluation |
|---|---|---|---|---|---|---|
| 1 | ○ | ○ | ○ | ⊙ | ⊙ | ⊙ |
| 2 | ○ | ○ | ○ | ⊙ | ⊙ | ⊙ |
| 3 | ○ | ○ | ○ | ⊙ | ⊙ | ⊙ |
| 4 | ○ | ○ | ○ | ⊙ | ⊙ | ⊙ |
| *5 | ○ | ○ | ○ | X | — | X |
| 6 | ○ | ○ | ○ | ⊙ | ⊙ | ⊙ |
| 7 | ○ | ○ | ○ | ⊙ | ⊙ | ⊙ |
| 8 | ○ | ○ | ○ | ⊙ | ⊙ | ⊙ |
| 9 | ○ | ○ | ○ | ⊙ | ⊙ | ⊙ |
| 10 | ○ | ○ | ○ | ⊙ | ⊙ | ⊙ |
| 11 | ○ | ○ | ○ | ⊙ | ⊙ | ⊙ |
| 12 | ○ | ○ | ○ | ⊙ | ⊙ | ⊙ |
| 13 | ○ | ○ | ○ | ⊙ | ⊙ | ⊙ |

TABLE 4

| Sample No. | Symbol of paste for discharge auxiliary electrode | Firing condition | | | Characteristic evaluation | | | |
|---|---|---|---|---|---|---|---|---|
| | | [A] Step of forming core-shell structure | [B] Step of joining core portion and shell portion | [C] Step of forming pore in shell portion | Core-shell structure | Shell portion | | |
| | | | | | | Presence or absence of pore | Type of metal oxide | Thickness (μm) |
| *14 | P-6 | Cu / Ni | Cu / Ni | Cu / Ni | X | — | — | — |
| *15 | P-6 | Cu / NiO | Cu / Ni | Cu / Ni | X | — | — | — |
| *16 | P-6 | Cu / NiO | Cu / NiO | Cu / Ni | X | — | — | — |
| *17 | P-6 | Cu / NiO | Cu / Ni | Cu / NiO | X | — | — | — |
| *18 | P-7 | Cu | Cu | Cu | X | — | — | — |
| *19 | P-7 | Cu | Cu | $Cu_2O$ | X | — | — | — |
| *20 | P-7 | Cu | $Cu_2O$ | $Cu_2O$ | X | — | — | — |
| *21 | P-7 | $Cu_2O$ | $Cu_2O$ | $Cu_2O$ | X | — | — | — |
| *22 | P-8 | Cu / $Al_2O_3$ | Cu / $Al_2O_3$ | Cu / $Al_2O_3$ | X | — | — | — |
| *23 | P-8 | Cu / $Al_2O_3$ | Cu / $Al_2O_3$ | $Cu_2O$ / $Al_2O_3$ | X | — | — | — |
| *24 | P-8 | Cu / $Al_2O_3$ | $Cu_2O$ / $Al_2O_3$ | Cu / $Al_2O_3$ | X | — | — | — |
| *25 | P-8 | Cu / $Al_2O_3$ | $Cu_2O$ / $Al_2O_3$ | $Cu_2O$ / $Al_2O_3$ | X | — | — | — |

| Sample No. | Characteristic evaluation | | | | | |
|---|---|---|---|---|---|---|
| | Presence or absence of glass-containing substance | Initial short-circuit | Short-circuit resistance | Peak voltage | Peak voltage after drop impact | Comprehensive evaluation |
| *14 | ○ | X | — | — | — | X |
| *15 | ○ | X | — | — | — | X |
| *16 | ○ | X | — | — | — | X |
| *17 | ○ | X | — | — | — | X |
| *18 | ○ | X | — | — | — | X |
| *19 | ○ | ○ | ○ | X | — | X |
| *20 | ○ | ○ | ○ | X | — | X |
| *21 | ○ | ○ | ○ | X | — | X |
| *22 | ○ | X | — | — | — | X |
| *23 | ○ | ○ | ○ | X | — | X |
| *24 | ○ | X | — | — | — | X |
| *25 | ○ | ○ | ○ | X | — | X |

In Tables 3 and 4, the numbers of samples that are out of the scope of the present invention are marked with symbol *.

In the ESD protection devices of Samples 1 to 4 and Samples 6 to 13, all of which are within the scope of the present invention, the structure of metal particles in the discharge auxiliary electrode is a core-shell structure including a shell portion composed of a metal oxide. Accordingly, these ESD protection devices had excellent ESD protection characteristics (initial short-circuit characteristics, short-circuit resistance, peak voltage characteristics, and peak voltage characteristics after drop impact).

Figure 11:
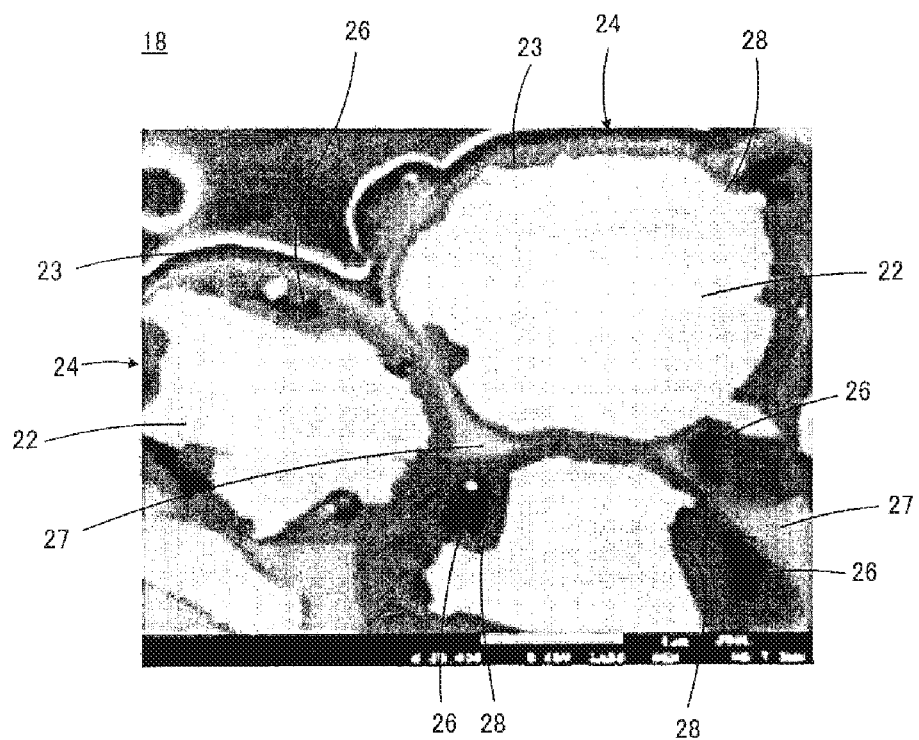
FIG. 11 is a photograph showing a cross-sectional scanning transmission electron microscope (STEM) image of a part of a discharge auxiliary electrode included in an ESD protection device of Sample 6 prepared in an experimental example.
Figure 12:
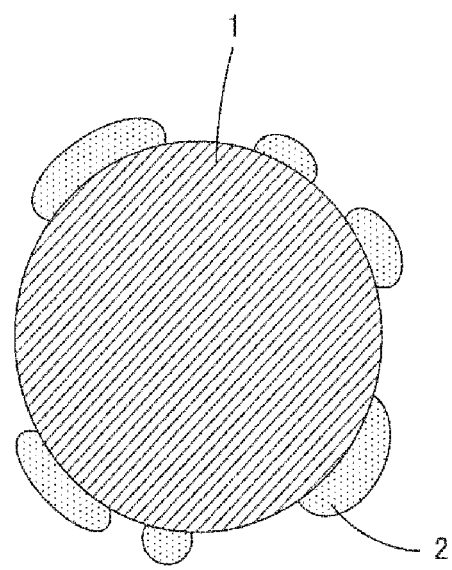
FIG. 12 illustrates a problem that may occur in the technology described in Patent Document 2 and is a cross-sectional view that schematically shows the state of a conductive material 1 and an inorganic material 2 after firing.

FIG. 11 is a photograph showing a cross-sectional scanning transmission electron microscope (STEM) image of a part of the discharge auxiliary electrode included in the ESD protection device of Sample 6, which is within the scope of the present invention. FIG. 2 described above is a view prepared by tracing the outline of FIG. 11. Accordingly, FIG. 11 will be described using the same reference numerals as those used in FIG. 2. In the discharge auxiliary electrode shown in FIG. 11, an aggregate of a plurality of metal particles 24 having a core-shell structure including a core portion 22 and a shell portion 23 is observed. In at least part of the shell portion 23, the presence of pores 26 is confirmed. It is confirmed that, in the core portion 22, a large number of portions each having a depression 28 having a shape that receives a pore 26 are present in the vicinity of the pores 26. It is also confirmed that the plurality of metal particles 24 are bound to each other with a glass-containing substance 27.

In order to clarify the core-shell structure of metal particles in a discharge auxiliary electrode of a sample within the scope of the present invention, a structural analysis before and after the firing was conducted on the basis of an STEM image, an EDS (energy-dispersive X-ray spectrometer) image, etc. for metal particles in Sample 6 prepared by using a Cu—Al alloy powder.

According to the analysis, before firing, a clear shell was not observed on the surfaces of the particles. In addition, a Cu component and an Al component were present at substantially the same positions. Furthermore, as a result of powder X-ray diffractometry (XRD), an $AlCu_3$ component and a Cu component were detected.

After firing, a core-shell structure including a shell portion having pores therein was observed. From the EDS image, it was confirmed that the core portion contained a Cu component as a main component and the shell portion was composed of an oxide containing Al as a main component. Furthermore, as a result of an analysis by XRD, a Cu component was detected and an $Al_2O_3$ component was not confirmed. These results suggested that the shell portion containing an Al component as a main component was amorphous (composed of a glass-containing substance).

From the above-described structural analysis of the metal particles, it is believed that the discharge auxiliary electrode of samples within the scope of the present invention is formed of an aggregate of core-shell metal particles including a shell portion which contains an $Al_2O_3$ component as a main component and which has pores and a core portion containing a Cu component as a main component, and that the core-shell metal particles are bound to each other with a glass-containing substance in the shell portion.

In contrast, regarding the ESD protection device of Sample 5, which was out of the scope of the present invention, the peak voltage characteristics were not good. It is believed that this is because an oxygen concentration at which Cu is oxidized was used in the firing, and thus the electrical conductivity of the metal particles was significantly decreased.

Regarding the ESD protection devices of Samples 14 to 17, which were out of the scope of the present invention, the initial short-circuit characteristics were not good because the structure of the metal particles in the discharge auxiliary electrode was not the core-shell structure including a shell portion composed of a metal oxide. The reason for this is believed that an oxygen concentration at which Ni is not oxidized or Ni is reduced was used in any of the [A] step of forming a core-shell structure, the [B] step of joining a core portion and a shell portion, and the [C] step of forming a pore in a shell portion in the firing step, and thus a shell portion composed of NiO was not formed.

In the ESD protection devices of Samples 18 to 21, which are out of the scope of the present invention, the paste "P-7" (refer to Table 1) which contained a copper powder rather than an alloy powder was used as the "paste for a discharge auxiliary electrode". Therefore, the structure of metal particles in the discharge auxiliary electrode could not become a core-shell structure including a shell portion composed of a metal oxide. Consequently, initial short-circuit defects or peak voltage defects were generated. It is believed that the initial short-circuit defects were generated by reduction of a Cu component, and the peak voltage defects were generated by oxidation of the Cu component.

In the ESD protection devices of Samples 22 to 25, which are out of the scope of the present invention, the paste "P-8" (refer to Table 2) which contained a copper powder coated with $Al_2O_3$, the powder being prepared by immobilizing nano-sized $Al_2O_3$ particles on the surfaces of Cu particles by a mechano-fusion method, rather than an alloy powder was used as the "paste for a discharge auxiliary electrode". Therefore, the structure of metal particles in the discharge auxiliary electrode could not become a core-shell structure including a shell portion having a high coating property. Consequently, initial short-circuit defects or peak voltage defects were generated. It is believed that the initial short-circuit defects were generated by reduction of a Cu component, and the peak voltage defects were generated by oxidation of the Cu component.

Experimental Example 2

Experimental Example 2 was performed in order to confirm that, in particular, in a discharge auxiliary electrode, a glass-containing substance that contributes to the binding between a plurality of metal particles is mainly obtained by being supplied from an insulator base. In other words, Experimental Example 2 was performed in order to confirm that a plurality of metal particles are not easily bound to each other with a glass-containing substance unless the glass-containing substance is supplied from an insulator base to a discharge auxiliary electrode.

As shown in Table 5, Sample 26 was prepared by substantially the same method as in the case of Sample 6 prepared in Experimental Example 1. However, in the preparation of the ESD protection device of Sample 26, before the unfired discharge auxiliary electrode 32 is formed on the ceramic green sheet 31 in the step shown in FIG. 4, a sealing layer composed of a paste containing $Al_2O_3$ was formed so that the ceramic green sheet 31 did not directly contact the unfired discharge auxiliary electrode 32. Except for this, the ESD protection device of Sample 26 was prepared by the same method as in the case of Sample 6 prepared in Experimental Example 1.

Characteristics of the ESD protection device of Sample 26 were examined by the same methods as those used in Experimental Example 1. Table 5 shows the results.

TABLE 5

| | | Firing condition | | | Characteristic evaluation | | | |
|---|---|---|---|---|---|---|---|---|
| | | [A] | [B] | [C] | | Shell portion | | |
| Sample No. | Symbol of paste for discharge auxiliary electrode | Step of forming core-shell structure | Step of joining core portion and shell portion | Step of forming pore in shell portion | Core-shell structure | Presence or absence of pore | Type of metal oxide | Thickness (μm) |
| 26 | P-2 | Cu $Al_2O_3$ | Cu $Al_2O_3$ | Cu $Al_2O_3$ | ○ | ○ | $Al_2O_3$ | 100 to 1000 |

| | | Characteristic evaluation | | | | | |
|---|---|---|---|---|---|---|---|
| Sample No. | Presence or absence of glass-containing substance | Initial short-circuit | Short-circuit resistance | Peak voltage | Peak voltage after drop impact | Comprehensive evaluation | |
| 26 | X | ○ | ○ | ⊙ | ○ | ○ | |

In the ESD protection device of Sample 26, the "presence or absence of glass-containing substance" was evaluated as "x". Although the characteristics of "peak voltage after drop impact" of the ESD protection device of Sample 26 was somewhat inferior to that of the ESD protection device of Sample 6 accordingly, the ESD protection device of Sample 26 could be provided for practical use. Comparing the discharge auxiliary electrode of Sample 26 with the discharge auxiliary electrode portion of Sample 6, the amount of glass-containing substance that was present between core-shell metal particles in the discharge auxiliary electrode of Sample 26 was somewhat smaller than that of Sample 6.

11, 42 ESD protection device
12 insulator base
16, 17 discharge electrode
18 discharge auxiliary electrode
19, 41 cavity
20, 21 outer terminal electrode
22 core portion
23 shell portion
24 metal particle
25 alloy particle
26 pore
27 glass-containing substance
28 depression
31, 36 ceramic green sheet
32 unfired discharge auxiliary electrode
33, 34 unfired discharge electrode
35 unfired thermally removable layer
37 unfired insulator base
38, 39 unfired outer terminal electrode
40 unfired ESD protection device
G gap

The invention claimed is:

1. An ESD protection device comprising:
a first discharge electrode and a second discharge electrode that are disposed so as to face each other;
a discharge auxiliary electrode formed so as to span between the first discharge electrode and the second discharge electrode; and
an insulator base that holds the first discharge electrode, the second discharge electrode, and the discharge auxiliary electrode,
wherein the discharge auxiliary electrode includes an aggregate of a plurality of metal particles each having a core-shell structure including a core portion that contains, as a main component, a first metal and a shell portion that contains, as a main component, a metal oxide containing a second metal, and
a pore is present in at least part of the shell portion.

2. The ESD protection device according to claim 1, wherein the core portion has a depression in a vicinity of the pore.

3. The ESD protection device according to claim 1, wherein the aggregate of the metal particles contains a glass-containing substance that binds the metal particles to each other.

4. The ESD protection device according to claim 1, wherein the shell portion has a thickness of 50 to 1,500 nm.

5. The ESD protection device according to claim 1, wherein the second metal is more susceptible to oxidation than the first metal.

6. The ESD protection device according to claim 5, wherein the first metal is copper or a copper-based alloy containing copper as a main component.

7. The ESD protection device according to claim 5, wherein the metal oxide containing the second metal is at least one selected from aluminum oxide, silicon oxide, magnesium oxide, and nickel oxide.

8. The ESD protection device according to claim 5, wherein the core portion contains the second metal as an auxiliary component.

9. The ESD protection device according to claim 1, wherein the first discharge electrode, the second discharge electrode, and the discharge auxiliary electrode are disposed inside the insulator base, the insulator base has a cavity for creating a gap between the first discharge electrode and the second discharge electrode, and the ESD protection device further comprises a first outer terminal electrode and a second outer terminal electrode that are formed on surfaces of the insulator base and that are respectively electrically connected to the first discharge electrode and the second discharge electrode.

10. A method for producing an ESD protection device comprising the steps of:
preparing an alloy powder composed of an alloy containing a first metal and a second metal that is more susceptible to oxidation than the first metal;
preparing an insulator base;
forming an unfired discharge auxiliary electrode containing the alloy powder on a surface of or inside the insulator base;
forming, on a surface of or inside the insulator base, a first discharge electrode and a second discharge electrode that are disposed so as to face each other on the discharge auxiliary electrode; and
firing the unfired discharge auxiliary electrode,
wherein the step of firing the unfired discharge auxiliary electrode includes the steps of, in each of alloy particles constituting the alloy powder,
conducting heat treatment in an atmosphere having an oxygen concentration at which the first metal is not oxidized and the second metal is oxidized in order to form a shell portion containing, as a main component, a metal oxide containing the second metal, the metal oxide being formed by moving the second metal toward the surface of the alloy particle and oxidizing the second metal at the time when the second metal reaches the surface, and to form a core portion containing, as a main component, the first metal that is left as a result of the movement of the second metal toward the surface of the alloy particle,
subsequently conducting heat treatment so as to join the core portion containing, as the main component, the first metal with the shell portion containing, as the main component, the metal oxide containing the second metal, and
subsequently decreasing a temperature to form a pore in the shell portion by shrinking the core portion containing, as the main component, the first metal more significantly than the shell portion containing, as the main component, the metal oxide containing the second metal.

11. The method for producing an ESD protection device according to claim 10, wherein the step of preparing an alloy powder includes a step of producing the alloy powder by using an atomizing method.

12. The method for producing an ESD protection device according to claim 10,
wherein the step of preparing an insulator base includes a step of preparing a plurality of ceramic green sheets including a first ceramic green sheet and a second ceramic green sheet,
the step of forming an unfired discharge auxiliary electrode and the step of forming a first discharge electrode and a second discharge electrode are performed on the first ceramic green sheet,
the method further comprises the steps of
forming a thermally removable layer so as to cover a gap between the first discharge electrode and the second discharge electrode,
obtaining an unfired insulator base by stacking the second ceramic green sheet on the first ceramic green sheet so as to cover the unfired discharge auxiliary electrode, the first discharge electrode, the second discharge electrode, and the thermally removable layer, and forming, on surfaces of the insulator base, a first outer terminal electrode and a second outer terminal electrode that are respectively electrically connected to the first discharge electrode and the second discharge electrode, and wherein the step of firing the unfired discharge auxiliary electrode includes a step of obtaining the insulator base by sintering the ceramic green sheets and a step of removing the thermally removable layer by being burnt away.

13. The ESD protection device according to claim 2, wherein the aggregate of the metal particles contains a glass-containing substance that binds the metal particles to each other.

14. The ESD protection device according to claim 2, wherein the shell portion has a thickness of 50 to 1,500 nm.

15. The ESD protection device according to claim 3, wherein the shell portion has a thickness of 50 to 1,500 nm.

16. The ESD protection device according to claim 2, wherein the second metal is more susceptible to oxidation than the first metal.

17. The ESD protection device according to claim 3, wherein the second metal is more susceptible to oxidation than the first metal.

18. The ESD protection device according to claim 4, wherein the second metal is more susceptible to oxidation than the first metal.

19. The ESD protection device according to claim 5, wherein the metal oxide containing the second metal is at least one selected from aluminum oxide, silicon oxide, magnesium oxide, and nickel oxide.

20. The ESD protection device according to claim 6, wherein the core portion contains the second metal as an auxiliary component.

* * * * *